(12) United States Patent
Kim (10) Patent No.: US 9,559,691 B1
(45) Date of Patent: Jan. 31, 2017

(54) SEMICONDUCTOR DEVICE AND SEMICONDUCTOR SYSTEM

(71) Applicant: SK hynix Inc., Icheon-si Gyeonggi-do (KR)

(72) Inventor: Jae Il Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/926,941

(22) Filed: Oct. 29, 2015

(30) Foreign Application Priority Data

Aug. 20, 2015 (KR) ........................ 10-2015-0117457

(51) Int. Cl.
*H03K 19/003* (2006.01)
*H03K 19/00* (2006.01)

(52) U.S. Cl.
CPC ................................ *H03K 19/0005* (2013.01)

(58) Field of Classification Search
None
See application file for complete search history.

(56) References Cited

U.S. PATENT DOCUMENTS

| | | | | |
|---|---|---|---|---|
| 7,332,904 B1* | 2/2008 | Menkus | ............. | H03K 19/0005 257/48 |
| 7,362,128 B2* | 4/2008 | Choi | ................. | H03K 19/0005 326/30 |
| 7,495,469 B2* | 2/2009 | Park | ................... | H03K 19/0005 326/27 |
| 7,889,014 B1* | 2/2011 | Stoiber | ................ | H03K 3/0315 331/176 |
| 2003/0218477 A1* | 11/2003 | Jang | .................... | H04L 25/0298 326/30 |
| 2008/0048714 A1* | 2/2008 | Lee | .................... | H03K 19/0005 326/30 |
| 2009/0115449 A1* | 5/2009 | Kim | ...................... | G11C 5/063 326/30 |
| 2009/0146683 A1* | 6/2009 | Kim | .................. | H03K 19/0005 326/30 |
| 2009/0243748 A1* | 10/2009 | Kinoshita | .......... | H03K 19/0005 333/17.3 |
| 2011/0025373 A1* | 2/2011 | Kim | ...................... | G11C 29/02 326/30 |
| 2011/0241653 A1* | 10/2011 | Kim | .................. | H03K 19/0005 324/76.83 |
| 2011/0291699 A1* | 12/2011 | Cho | .................... | H04L 25/0298 326/30 |
| 2012/0146687 A1* | 6/2012 | Kim | .................. | H03K 19/0005 326/30 |
| 2013/0207736 A1* | 8/2013 | Lee | ........................ | G01R 27/02 333/17.3 |

FOREIGN PATENT DOCUMENTS

KR 1020110131368 A 12/2011
KR 1020130093231 A 8/2013

* cited by examiner

*Primary Examiner* — Crystal L Hammond
(74) *Attorney, Agent, or Firm* — William Park & Associates Ltd.

(57) ABSTRACT

A semiconductor system may include a first semiconductor device configured to output a test stop signal and a calibration control signal. The semiconductor system may include a second semiconductor device configured to generate a first state code from an external resistor, a second state code from an internal resistor, and a third state code from a fuse array in response to the calibration control signal, and to select one of the first to third state codes as a selection code in response to the test stop signal and the calibration control signal.

20 Claims, 8 Drawing Sheets

| CSEL<1:4> | PROCESS STATE |
|---|---|
| 0000 | TT |
| 0001 | SS |
| 0010 | ST |
| 0011 | SF |
| 0100 | TS |
| 0101 | TF |
| 0110 | FS |
| 0111 | FT |
| 1000 | FF |

FIG. 8

US 9,559,691 B1

SEMICONDUCTOR DEVICE AND SEMICONDUCTOR SYSTEM

CROSS-REFERENCE TO RELATED APPLICATION

The present application claims priority under 35 U.S.C. §119(a) to Korean application number 10-2015-0117457, filed on Aug. 20, 2015, in the Korean Intellectual Property Office, which is incorporated herein by reference in its entirety.

BACKGROUND

1. Technical Field

Embodiments of the present disclosure generally relate to a semiconductor device and a semiconductor system, and, more particularly, to a semiconductor device and a semiconductor system configured to use information on process states.

2. Related Art

Recently, semiconductor systems are required to perform high speed operations, and as a result timing margins between internal signals used in the semiconductor systems are reduced. Since threshold voltages and turn-on currents of NMOS transistors and PNMOS transistors included in the semiconductor systems are changed according to a change in process states, it has an influence on skews of internal signals used in the semiconductor systems. Since the timing margins between the internal signals are further reduced according to a change in the skews, an abnormal operation of the semiconductor system may occur.

As a swing width of a transmission signal interfaced between semiconductor devices included in the semiconductor system operating at a high speed is gradually reduced, reflection of a transmission signal due to impedance mismatching frequently occurs at an interface terminal. Since the impedance mismatching occurs due to a phenomenon such as a change in process states, an impedance matching circuit such as an on-die termination circuit is used in the semiconductor system.

SUMMARY

In an embodiment, a semiconductor system may include a first semiconductor device configured to output a test stop signal and a calibration control signal. The semiconductor system may include a second semiconductor device configured to generate a first state code from an external resistor, a second state code from an internal resistor, and a third state code from a fuse array in response to the calibration control signal, and to select one of the first to third state codes as a selection code in response to the test stop signal and the calibration control signal.

In an embodiment, a semiconductor device may include a first state code generation unit configured to generate a first state code from an external resistor in response to a calibration control signal. The semiconductor device may include a second state code generation unit configured to generate a second state code from an internal resistor. The semiconductor device may include a third state code generation unit configured to generate a third state code from a fuse array. The semiconductor device may include a code selection unit configured to output one of the first to third state codes as a selection code in response to the calibration control signal and a test stop signal.

In an embodiment, a semiconductor device may include a first state code generation unit configured to generate a first state code from an external resistor in response to a calibration control signal. The semiconductor device may include a second state code generation unit configured to generate a second state code from an internal resistor in response to the calibration control signal. The semiconductor device may include a third state code generation unit configured to generate a third state code from a fuse array. The semiconductor device may include a code selection unit configured to output one of the first to third state codes as a selection code in response to the calibration control signal and a test stop signal.

In an embodiment, a semiconductor device may include a code selection unit configured to receive a plurality of state codes and output one of the plurality of state codes as a selection code to adjust a delay period within the semiconductor device according to process states included in the selection code.

DETAILED DESCRIPTION

Hereinafter, the semiconductor device and the semiconductor system will be described below with reference to the accompanying drawings through various examples of embodiments.

Impedance calibration (ZQ) indicates a process for generating codes in order to adjust a resistance value of an on-die termination circuit according to a change in process states. The on-die termination circuit having the resistance value adjusted according to the impedance calibration may remove impedance matching of an interface terminal, thereby substantially preventing a transmission signal from being distorted by reflection.

Various embodiments may be directed to a semiconductor device and a semiconductor system, by which it may be possible to generate codes including information on process states by various methods.

In accordance with an embodiment, codes including information on process states may be generated to reduce a skew of an internal signal, and a transmission signal inputted from an exterior may be received with distortion.

Furthermore, in accordance with an embodiment, the codes including information on process states may also be generated using an external resistor or an internal resistor.

Furthermore, in accordance with an embodiment, the codes including information on process states may also be generated using a fuse array.

Figure 1:
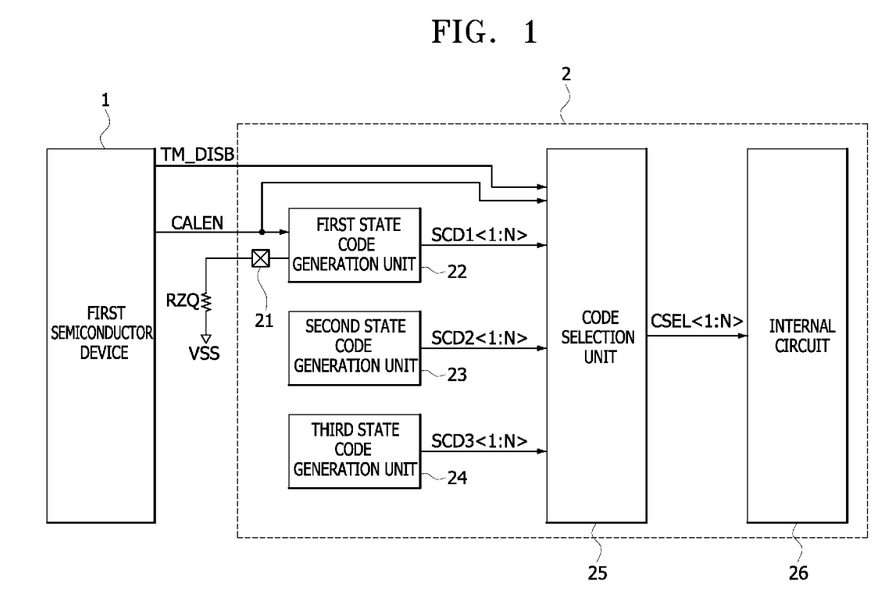
FIG. 1 is a block diagram illustrating a representation of an example of a configuration of a semiconductor system in accordance with an embodiment.

Referring to FIG. 1, a semiconductor system in accordance with an embodiment may include a first semiconductor device 1 and a second semiconductor device 2.

The first semiconductor device 1 may output a test stop signal TM_DISB and a calibration control signal CALEN. The test stop signal TM_DISB may be enabled in order to stop a test performed in order to generate selection codes CSEL<1:N> (i.e., N may be an integer greater than 1). A logic level at which the test stop signal TM_DISB is enabled may be differently set according to various embodiments. When the test stop signal TM_DISB is enabled, all bits included in the selection codes CSEL<1:N> may be set to a preset level, for example, a logic low level. The calibration control signal CALEN may be enabled in order to activate an operation for generating first state codes SCD1<1:N> according to an external resistor RZQ. A logic level at which the calibration control signal CALEN is enabled may be differently set according to various embodiments.

The second semiconductor device 2 may receive the test stop signal TM_DISB and the calibration control signal CALEN. According to embodiments, the second semiconductor device 2 may also be configured to decode a command applied from the first semiconductor device 1 to generate the test stop signal TM_DISB and the calibration control signal CALEN. The second semiconductor device 2 may include a pad 21, a first state code generation unit 22, a second state code generation unit 23, a third state code generation unit 24, a code selection unit 25, and an internal circuit 26.

The pad 21 may be coupled to the external resistor RZQ. The external resistor RZQ may be coupled to a ground voltage VSS. A resistance value of the external resistor RZQ may be variously set according to embodiments.

The first state code generation unit 22 may generate the first state codes SCD1<1:N> from the external resistor RZQ in response to the calibration control signal CALEN. For example, when the calibration control signal CALEN is enabled, the first state code generation unit 22 may set logic level combinations of the first state codes SCD1<1:N> according to a voltage of the pad 21 to which the external resistor RZQ is coupled.

Figure 3:
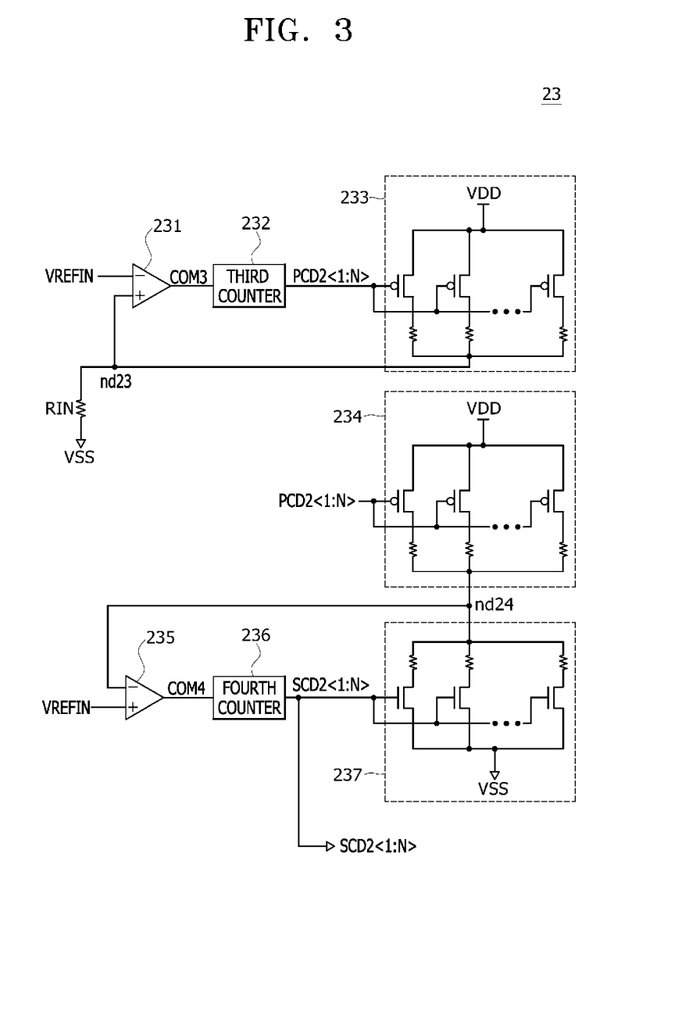
FIG. 3 is a diagram illustrating a representation of an example of a configuration in accordance with an embodiment of a second state code generation unit included in a semiconductor system illustrated in FIG. 1.

The second state code generation unit 23 may generate second state codes SCD2<1:N> from an internal resistor (RIN of FIG. 3). For example, the second state code generation unit 23 may set logic level combinations of the second state codes SCD2<1:N> according to a voltage of a node to which the internal resistor (RIN of FIG. 3) is coupled.

The third state code generation unit 24 may include a fuse array (not illustrated) and generate third state codes SCD3<1:N>. The fuse array (not illustrated) may include fuses which may be programmed by using laser or electricity. The fuse array (not illustrated) may be programmed in order to store information on process states. The programming of the fuse array (not illustrated) may be performed in a wafer process or a package process according to embodiments. The third state code generation unit 24 may generate and output the third state codes SCD3<1:N> having logic level combinations set according to the programmed state of the fuse array (not illustrated).

The code selection unit 25 may select one of the first state codes SCD1<1:N>, the second state codes SCD2<1:N>, or the third state codes SCD3<1:N> as the selection codes CSEL<1:N> in response to the test stop signal TM_DISB and the calibration control signal CALEN, and output the selection codes CSEL<1:N>. When the fuse array (not illustrated) has been programmed, the code selection unit 25 may output the third state codes SCD3<1:N> as the selection codes CSEL<1:N>. In the state in which the fuse array (not illustrated) has not been programmed, when the calibration control signal CALEN is enabled, the code selection unit 25 may output the first state codes SCD1<1:N> as the selection codes CSEL<1:N>. In the state in which the fuse array (not illustrated) has not been programmed, when the calibration control signal CALEN is disabled, the code selection unit 25 may output the second state codes SCD2<1:N> as the selection codes CSEL<1:N>.

An internal operation of the internal circuit 26 may be controlled according to the selection codes CSEL<1:N>. For example, the internal circuit 26 may be implemented with a delay circuit having a delay period adjusted according to the information on process states included in the selection codes CSEL<1:N>. The internal circuit 26 may decrease or increase the delay period of the delay circuit according to the information on process states included in the selection codes CSEL<1:N>. The internal circuit 26 may be implemented with various circuits which perform internal operations differently controlled according to the information on process states.

Figure 2:
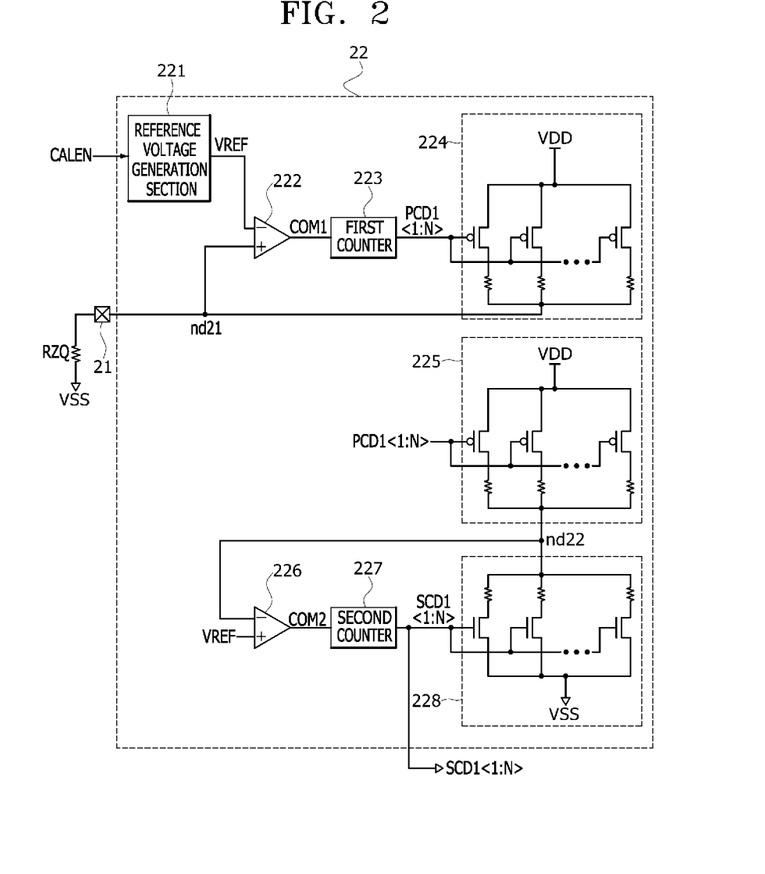
FIG. 2 is a diagram illustrating a representation of an example of a configuration in accordance with an embodiment of a first state code generation unit included in a semiconductor system illustrated in FIG. 1.

Referring to FIG. 2, the first state code generation unit 22 may include a reference voltage generation section 221, a first comparator 222, a first counter 223, a first pull-up driving section 224, a second pull-up driving section 225, a second comparator 226, a second counter 227, and a first pull-down driving section 228.

The reference voltage generation section 221 may generate a reference voltage VREF in response to the calibration control signal CALEN. For example, when the calibration control signal CALEN is enabled, the reference voltage generation section 221 may generate the reference voltage VREF having a constant level according to a change in process states.

The first comparator 222 may compare a voltage of a node nd21 coupled to the pad 21 with the reference voltage VREF to generate a first comparison signal COM1. For example, when the voltage of the node nd21 has a level higher than that of the reference voltage VREF, the first comparator 222 may generate a first comparison signal COM1 at a logic high level, and when the voltage of the node nd21 has a level lower than that of the reference voltage VREF, the first comparator 222 may generate a first comparison signal COM1 at a logic low level. The logic levels of the first comparison signal COM1 generated according to the comparison results of the voltage of the node nd21 and the reference voltage VREF may be differently set according to embodiments.

The first counter 223 may count first pull-up codes PCD1<1:N> in response to the first comparison signal COM1. The first counter 223 may up-count or down-count the first pull-up codes PCD1<1:N> according to the logic levels of the first comparison signal COM1.

A resistance value of the first pull-up driving section 224 is adjusted according to the first pull-up codes PCD1<1:N>. A calibration operation for counting the first pull-up codes PCD1<1:N> may be performed until the resistance value of the first pull-up driving section 224 is substantially equal to that of the external resistor RZQ. According to embodiments, the resistance value of the first pull-up driving section 224 may also be set to be different from that of the external resistor RZQ. The first pull-up driving section 224 may be coupled to a voltage supply VDD.

A resistance value of the second pull-up driving section 225 is adjusted according to the first pull-up codes PCD1<1:N>. Accordingly, the resistance value of the second pull-up driving section 225 may be adjusted to be substantially equal to those of the first pull-up driving section 224 and the external resistor RZQ. According to embodiments, the resistance value of the second pull-up driving section 225 may also be set to be different from those of the first pull-up driving section 224 and the external resistor RZQ. The second pull-up driving section 225 may be coupled to a voltage supply VDD.

The second comparator 226 may compare a voltage of a node nd22 with the reference voltage VREF to generate a second comparison signal COM2. For example, when the voltage of the node nd22 has a level higher than that of the reference voltage VREF, the second comparator 226 may generate a second comparison signal COM2 at a logic low level, and when the voltage of the node nd22 has a level lower than that of the reference voltage VREF, the second comparator 226 may generate a second comparison signal COM2 at a logic high level. The logic levels of the second comparison signal COM2 generated according to the comparison results of the voltage of the node nd22 and the reference voltage VREF may be differently set according to embodiments.

The second counter 227 may count the first state codes SCD1<1:N> in response to the second comparison signal COM2. The second counter 227 may up-count or down-count the first state codes SCD1<1:N> according to the logic levels of the second comparison signal COM2.

A resistance value of the first pull-down driving section 228 is adjusted according to the first state codes SCD1<1:N>. Accordingly, the resistance value of the first pull-down driving section 228 may also be adjusted to be substantially equal to that of the second pull-up driving section 225. According to embodiments, the resistance value of the first pull-down driving section 228 may also be set to be different from that of the second pull-up driving section 225. The first pull-down driving section 228 may be coupled to a ground voltage VSS.

The first state code generation unit 22 configured as described above counts the first pull-up codes PCD1<1:N> such that the resistance values of the first pull-up driving section 224 and the second pull-up driving section 225 are substantially equal to that of the external resistor RZQ, and counts the first state codes SCD1<1:N> such that the resistance value of the first pull-down driving section 228 is substantially equal to that of the second pull-up driving section 225. Since the resistance values of the first pull-up driving section 224, the second pull-up driving section 225, and the first pull-down driving section 228 are changed according to a change in process states, the first state codes SCD1<1:N> may include information on the process states.

Referring to FIG. 3, the second state code generation unit 23 may include a third comparator 231, a third counter 232, a third pull-up driving section 233, a fourth pull-up driving section 234, a fourth comparator 235, a fourth counter 236, and a second pull-down driving section 237.

The third comparator 231 may compare a voltage of a node nd23 coupled to an internal resistor RIN with an internal reference voltage VREFIN to generate a third comparison signal COM3. For example, when the voltage of the node nd23 has a level higher than that of the internal reference voltage VREFIN, the third comparator 231 may generate a third comparison signal COM3 at a logic high level, and when the voltage of the node nd23 has a level lower than that of the internal reference voltage VREFIN, the third comparator 231 may generate a third comparison signal COM3 at a logic low level. The logic levels of the third comparison signal COM3 generated according to the comparison results of the voltage of the node nd23 and the internal reference voltage VREFIN may be differently set according to embodiments.

The third counter 232 may count second pull-up codes PCD2<1:N> in response to the third comparison signal COM3. The third counter 232 may up-count or down-count the second pull-up codes PCD2<1:N> according to the logic levels of the third comparison signal COM3.

A resistance value of the third pull-up driving section 233 is adjusted according to the second pull-up codes PCD2<1:N>. A calibration operation for counting the second pull-up codes PCD2<1:N> may be performed until the resistance value of the third pull-up driving section 233 is substantially equal to that of the internal resistor RIN. According to embodiments, the resistance value of the third pull-up driving section 233 may also be set to be different from that of the internal resistor RIN. The third pull-up driving section 233 may be coupled to a voltage supply VDD.

A resistance value of the fourth pull-up driving section 234 is adjusted according to the second pull-up codes PCD2<1:N>. Accordingly, the resistance value of the fourth pull-up driving section 234 may be adjusted to be substantially equal to those of the third pull-up driving section 233 and the internal resistor RIN. According to embodiments, the resistance value of the fourth pull-up driving section 234 may also be set to be different from those of the third pull-up driving section 233 and the internal resistor RIN. The fourth pull-up driving section 234 may be coupled to a voltage supply VDD.

The fourth comparator 235 may compare a voltage of a node nd24 with the internal reference voltage VREFIN to generate a fourth comparison signal COM4. For example, when the voltage of the node nd24 has a level higher than that of the internal reference voltage VREFIN, the fourth comparator 235 may generate a fourth comparison signal COM4 at a logic low level, and when the voltage of the node nd24 has a level lower than that of the internal reference voltage VREFIN, the fourth comparator 235 may generate a fourth comparison signal COM4 at a logic high level. The logic levels of the fourth comparison signal COM4 generated according to the comparison results of the voltage of the node nd24 and the internal reference voltage VREFIN may be differently set according to embodiments.

The fourth counter 236 may count the second state codes SCD2<1:N> in response to the fourth comparison signal COM4. The fourth counter 236 may up-count or down-count the second state codes SCD2<1:N> according to the logic levels of the fourth comparison signal COM4.

A resistance value of the second pull-down driving section 237 is adjusted according to the second state codes SCD2<1:N>. Accordingly, the resistance value of the second pull-down driving section 237 may also be adjusted to be substantially equal to that of the fourth pull-up driving section 234. According to embodiments, the resistance value of the second pull-down driving section 237 may also be set to be different from that of the fourth pull-up driving section 234. The second pull-down driving section 237 may be coupled to a ground voltage VSS.

The second state code generation unit 23 configured as described above counts the second pull-up codes PCD2<1:N> such that the resistance values of the third pull-up driving section 233 and the fourth pull-up driving section 234 are substantially equal to that of the internal resistor RIN, and counts the second state codes SCD2<1:N> such that the resistance value of the second pull-down driving section 237 is substantially equal to that of the fourth pull-up driving section 234. Since the resistance values of the third pull-up driving section 233, the fourth pull-up driving section 234, and the second pull-down driving section 237 are changed according to a change in process states, the second state codes SCD2<1:N> may include information on the process states.

Figure 4:
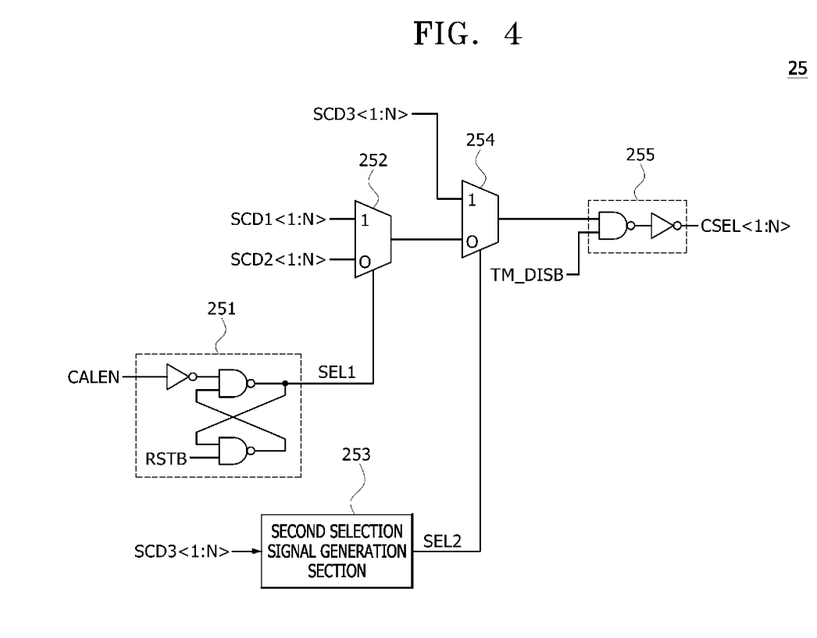
FIG. 4 is a diagram illustrating a representation of an example of a configuration in accordance with an embodiment of a code selection unit included in a semiconductor system illustrated in FIG. 1.

Referring to FIG. 4, the code selection unit 25 may include a first selection signal generation section 251, a first selector 252, a second selection signal generation section 253, a second selector 254, and an output buffer 255.

The first selection signal generation section 251 may generate a first selection signal SEL1 in response to the calibration control signal CALEN. For example, when the calibration control signal CALEN is enabled at a logic high level, the first selection signal generation section 251 generates a first selection signal SEL1 at a logic high level. When the calibration control signal CALEN and a reset signal RSTB are all at a logic low level, the first selection signal generation section 251 generates a first selection signal SEL1 at a logic low level. The reset signal RSTB may be applied to a logic low level in an initialization operation.

The first selector 252 may output the first state codes SCD1<1:N> or the second state codes SCD2<1:N> in response to the first selection signal SEL1. For example, when the first selection signal SEL1 is at a logic high level, the first selector 252 outputs the first state codes SCD1<1:N>, and when the first selection signal SEL1 is at a logic low level, the first selector 252 outputs the second state codes SCD2<1:N>.

The second selection signal generation section 253 may generate a second selection signal SEL2 in response to the third state codes SCD3<1:N>. For example, only when the third state codes SCD3<1:N> have preset level combinations, for example, are all set at a logic low level, the second selection signal generation section 253 may generate a second selection signal SEL2 at a logic low level. When the third state codes SCD3<1:N> do not have the preset level combinations, the second selection signal generation section 253 may generate a second selection signal SEL2 at a logic high level. When the fuse array (not illustrated) has been programmed in order to store the information on process states, the second selection signal generation section 253 may generate the second selection signal SEL2 at the logic high level.

The second selector 254 may output the third state codes SCD3<1:N> or an output signal of the first selector 252 in response to the second selection signal SEL2. For example, when the second selection signal SEL2 is at a logic high level, the second selector 254 outputs the third state codes SCD3<1:N>, and when the second selection signal SEL2 is at a logic low level, the second selector 254 outputs the output signal of the first selector 252.

The output buffer 255 may buffer and output an output signal of the second selector 254 in response to the test stop signal TM_DISB. When the test stop signal TM_DISB is enabled at a logic low level, the output buffer 255 may generate the selection codes CSEL<1:N> which have been set at a logic low level and disabled. When the test stop signal TM_DISB is disabled at a logic high level, the output buffer 255 may buffer and output the output signal of the second selector 254.

When the fuse array (not illustrated) has been programmed, the code selection unit 25 configured as described above may output the third state codes SCD3<1:N> as the selection codes CSEL<1:N>. In the state in which the fuse array (not illustrated) has not been programmed, when the calibration control signal CALEN is enabled, the code selection unit 25 may output the first state codes SCD1<1:N> as the selection codes CSEL<1:N>. In the state in which the fuse array (not illustrated) has not been programmed, when the calibration control signal CALEN is disabled, the code selection unit 25 may output the second state codes SCD2<1:N> as the selection codes CSEL<1:N>.

Figure 5:
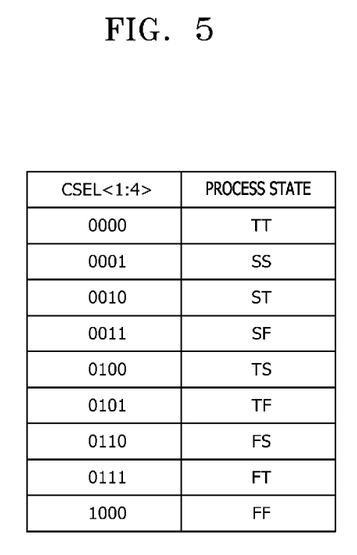
FIG. 5 is a table illustrating a representation of an example of information on process states corresponding to logic level combinations of selection codes generated in a semiconductor system illustrated in FIG. 1.

Referring to FIG. 5, it may be possible to confirm information on process states corresponding to logic level combinations of the selection codes CSEL<1:N> (i.e., CSEL<1:4>). For example, when the logic level combinations of the selection codes CSEL<1:4> are '0000', the process state may be set to 'TT', and when the logic level combinations of the selection codes CSEL<1:4> are '0001', the process state may be set to 'SS'. When the logic level combinations of the selection codes CSEL<1:4> are '0010', the process state may be set to 'ST', and when the logic level combinations of the selection codes CSEL<1:4> are '0011', the process state may be set to 'SF'. When the logic level combinations of the selection codes CSEL<1:4> are '0100', the process state may be set to 'TS', and when the logic level combinations of the selection codes CSEL<1:4> are '0101', the process state may be set to 'TF'. When the logic level combinations of the selection codes CSEL<1:4> are '0110', the process state may be set to 'FS', and when the logic level combinations of the selection codes CSEL<1:4> are '0111', the process state may be set to 'FT'. When the logic level combinations of the selection codes CSEL<1:4> are '1000', the process state may be set to 'FF'. The fact that the logic level combinations of the selection codes CSEL<1:4> are '0001' indicates that only the first bit CSEL<1> of the selection code is at a logic high level and the second to fourth bits CSEL<2:4> of the selection code are at a logic low level. The fact that the process state is 'TF' indicates that the NMOS transistor is in a standard operation speed state Typical and the PMOS transistor is in a fast operation speed state Fast. The fact that the process state is 'FS' indicates that the NMOS transistor is in a fast operation speed state Fast and the PMOS transistor is in a slow operation speed state Slow.

Figure 6:
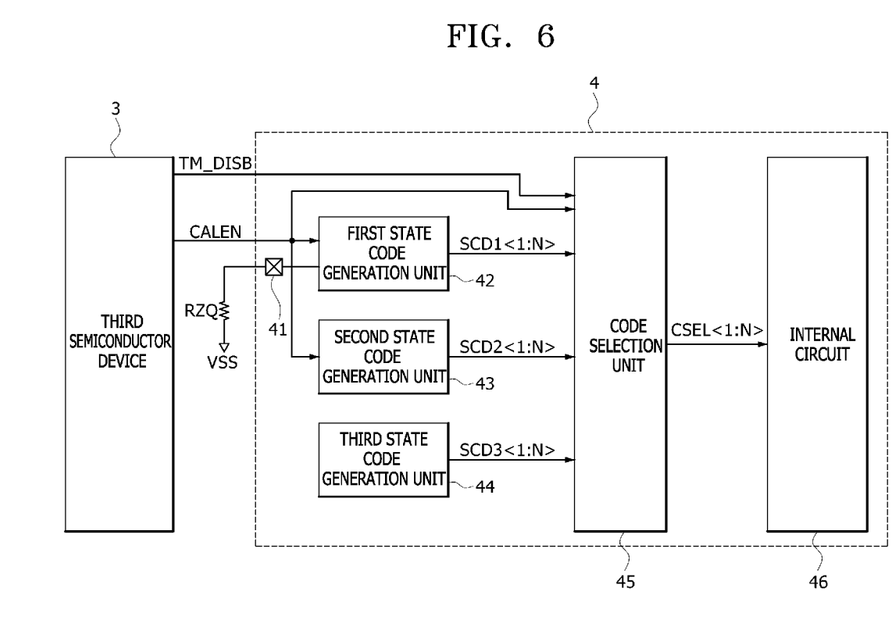
FIG. 6 is a block diagram illustrating a representation of an example of a configuration of a semiconductor system in accordance with another embodiment.

Referring to FIG. 6, a semiconductor system in accordance with an embodiment may include a third semiconductor device 3 and a fourth semiconductor device 4.

The third semiconductor device 3 may output a test stop signal TM_DISB and a calibration control signal CALEN. The test stop signal TM_DISB may be enabled in order to stop a test performed in order to generate selection codes CSEL<1:N>. A logic level at which the test stop signal TM_DISB is enabled may be differently set according to embodiments. When the test stop signal TM_DISB is enabled, all bits included in the selection codes CSEL<1:N> may be set to a preset level, for example, a logic low level. The calibration control signal CALEN may be enabled in order to activate an operation for generating first state codes SCD1<1:N> according to an external resistor RZQ. A logic level at which the calibration control signal CALEN is enabled may be differently set according to embodiments.

The fourth semiconductor device 4 may receive the test stop signal TM_DISB and the calibration control signal CALEN. According to embodiments, the fourth semiconductor device 4 may also be configured to decode a command applied from the third semiconductor device 3 to generate the test stop signal TM_DISB and the calibration control signal CALEN. The fourth semiconductor device 4 may include a pad 41, a first state code generation unit 42, a second state code generation unit 43, a third state code generation unit 44, a code selection unit 45, and an internal circuit 46.

The pad 41 may be coupled to the external resistor RZQ. The external resistor RZQ may be coupled to a ground voltage VSS. A resistance value of the external resistor RZQ may be variously set according to embodiments.

The first state code generation unit 42 may generate the first state codes SCD1<1:N> from the external resistor RZQ in response to the calibration control signal CALEN. For example, when the calibration control signal CALEN is enabled, the first state code generation unit 42 may set logic level combinations of the first state codes SCD1<1:N> according to a voltage of the pad 41 to which the external resistor RZQ is coupled.

Figure 7:
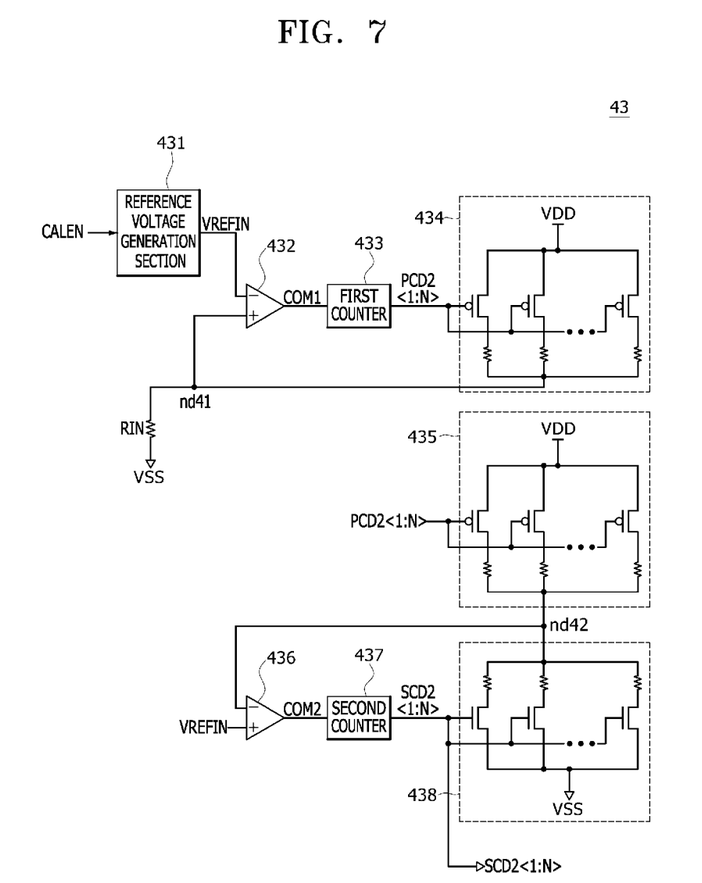
FIG. 7 is a diagram illustrating a representation of an example of a configuration in accordance with an embodiment of a second state code generation unit included in a semiconductor system illustrated in FIG. 6.

The second state code generation unit 43 may generate second state codes SCD2<1:N> from an internal resistor (RIN of FIG. 7). For example, when the second state code generation unit 43 may set logic level combinations of the second state codes SCD2<1:N> according to a voltage of a node to which the internal resistor (RIN of FIG. 7) is coupled.

The third state code generation unit 44 may include a fuse array (not illustrated) and generate third state codes SCD3<1:N>. The fuse array (not illustrated) may include fuses which may be programmed by using laser or electricity. The fuse array (not illustrated) may be programmed in order to store information on process states. The programming of the fuse array (not illustrated) may be performed in a wafer process or a package process according to embodiments. The third state code generation unit 44 may generate and output the third state codes SCD3<1:N> having logic level combinations set according to the programmed state of the fuse array (not illustrated).

The code selection unit 45 may select one of the first state codes SCD1<1:N>, the second state codes SCD2<1:N>, or the third state codes SCD3<1:N> as the selection codes CSEL<1:N> in response to the test stop signal TM_DISB and the calibration control signal CALEN, and output the selection codes CSEL<1:N>. When the fuse array (not illustrated) has been programmed, the code selection unit 45 may output the third state codes SCD3<1:N> as the selection codes CSEL<1:N>. In the state in which the fuse array (not illustrated) has not been programmed, when the calibration control signal CALEN is enabled, the code selection unit 45 may output the first state codes SCD1<1:N> as the selection codes CSEL<1:N>. In the state in which the fuse array (not illustrated) has not been programmed, when the calibration control signal CALEN is disabled, the code selection unit 45 may output the second state codes SCD2<1:N> as the selection codes CSEL<1:N>.

An internal operation of the internal circuit 46 may be controlled according to the selection codes CSEL<1:N>. For example, the internal circuit 46 may be implemented with a delay circuit having a delay period adjusted according to the information on process states included in the selection codes CSEL<1:N>. The internal circuit 46 may decrease or increase the delay period of the delay circuit according to the information on process states included in the selection codes CSEL<1:N>. The internal circuit 46 may be implemented with various circuits which perform internal operations differently controlled according to the information on process states.

Referring to FIG. 7, the second state code generation unit 43 may include a reference voltage generation section 431, a first comparator 432, a first counter 433, a first pull-up driving section 434, a second pull-up driving section 435, a second comparator 436, a second counter 437, and a pull-down driving section 438.

The reference voltage generation section 431 may generate an internal reference voltage VREFIN in response to the calibration control signal CALEN. For example, when the calibration control signal CALEN is enabled, the reference voltage generation section 431 may generate the internal reference voltage VREFIN having a constant level according to a change in process states.

The first comparator 432 may compare a voltage of a node nd41 coupled to an internal resistor RIN with the internal reference voltage VREFIN to generate a first comparison signal COM1. For example, when the voltage of the node nd41 has a level higher than that of the internal reference voltage VREFIN, the first comparator 432 may generate a first comparison signal COM1 at a logic high level, and when the voltage of the node nd41 has a level lower than that of the internal reference voltage VREFIN, the first comparator 432 may generate a first comparison signal COM1 at a logic low level. The logic levels of the first comparison signal COM1 generated according to the comparison results of the voltage of the node nd41 and the internal reference voltage VREFIN may be differently set according to embodiments.

The first counter 433 may count second pull-up codes PCD2<1:N> in response to the first comparison signal COM1. The first counter 433 may up-count or down-count the second pull-up codes PCD2<1:N> according to the logic levels of the first comparison signal COM1.

A resistance value of the first pull-up driving section 434 is adjusted according to the second pull-up codes PCD2<1:N>. A calibration operation for counting the second pull-up codes PCD2<1:N> may be performed until the resistance value of the first pull-up driving section 434 is substantially equal to that of the internal resistor RIN. According to embodiments, the resistance value of the first pull-up driving section 434 may also be set to be different from that of the internal resistor RIN. The first pull-up driving section 434 may be coupled to a voltage supply VDD.

A resistance value of the second pull-up driving section 435 is adjusted according to the second pull-up codes PCD2<1:N>. Accordingly, the resistance value of the second pull-up driving section 435 may be adjusted to be substantially equal to those of the first pull-up driving section 434 and the internal resistor RIN. According to embodiments, the resistance value of the second pull-up driving section 435 may also be set to be different from those of the first pull-up driving section 434 and the internal resistor RIN. The second pull-up driving section 435 may be coupled to a voltage supply VDD.

The second comparator 436 may compare a voltage of a node nd42 with the internal reference voltage VREFIN to generate a second comparison signal COM2. For example, when the voltage of the node nd42 has a level higher than that of the internal reference voltage VREFIN, the second comparator 436 may generate a second comparison signal COM2 at a logic low level, and when the voltage of the node nd42 has a level lower than that of the internal reference voltage VREFIN, the second comparator 436 may generate a second comparison signal COM2 at a logic high level. The logic levels of the second comparison signal COM2 generated according to the comparison results of the voltage of the node nd42 and the internal reference voltage VREFIN may be differently set according to embodiments.

The second counter 437 may count the second state codes SCD2<1:N> in response to the second comparison signal COM2. The second counter 437 may up-count or down-count the second state codes SCD2<1:N> according to the logic levels of the second comparison signal COM2.

A resistance value of the pull-down driving section 438 is adjusted according to the second state codes SCD2<1:N>. Accordingly, the resistance value of the first pull-down driving section 438 may also be adjusted to be substantially equal to that of the second pull-up driving section 435. According to embodiments, the resistance value of the pull-down driving section 438 may also be set to be different from that of the second pull-up driving section 435. The pull-down driving section 438 may be coupled to a ground voltage VSS.

The second state code generation unit 43 configured as described above counts the second pull-up codes PCD2<1:N> such that the resistance values of the first pull-up driving section 434 and the second pull-up driving section 435 are substantially equal to that of the internal resistor RIN, and counts the second state codes SCD2<1:N> such that the resistance value of the pull-down driving section 438 is substantially equal to that of the second pull-up driving section 435. Since the resistance values of the first pull-up driving section 434, the second pull-up driving section 435, and the pull-down driving section 438 are changed according to a change in process states, the second state codes SCD2<1:N> may include information on the process states.

The semiconductor device and the semiconductor system described in FIG. 1 to FIG. 7 may be applied to an electronic system including a memory system, a graphic system, a computing system, a mobile system and the like. For example, referring to FIG. 8, an electronic system 1000 in accordance with an embodiment may include a data storage unit 1001, a memory controller 1002, a buffer memory 1003, and an input/output interface 1004.

Figure 8:
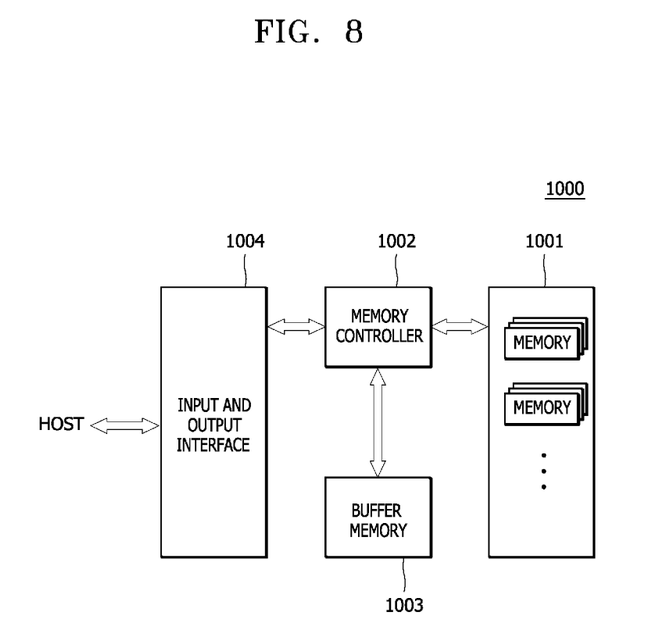
FIG. 8 is a diagram illustrating a representation of an example of a configuration in accordance with an embodiment of an electronic system to which a semiconductor device and a semiconductor system illustrated in FIG. 1 to FIG. 7 have been applied.

The data storage unit 1001 stores data applied from the memory controller 1002, reads the stored data, and outputs the read data to the memory controller 1002 according to a control signal from the memory controller 1002. The data storage unit 1001 may include the second semiconductor device 2 illustrated in FIG. 1 or the fourth semiconductor device 4 illustrated in FIG. 6. Furthermore, the data storage unit 1001 may include a nonvolatile memory capable of continuously storing data without losing the data although power is off. The nonvolatile memory may be implemented with a flash memory (a NOR Flash Memory and a NAND Flash Memory), a phase change random access memory (PRAM), a resistive random access memory (RRAM), a spin transfer torque random access memory (STTRAM), or a magnetic random access memory (MRAM).

The memory controller 1002 decodes a command applied from an external device (a host device) through the input/output interface 1004, and controls data input/output for the data storage unit 1001 and the buffer memory 1003 according to the decoding results. The memory controller 1002 may include the first semiconductor device 1 illustrated in FIG. 1 or the third semiconductor device 3 illustrated in FIG. 6. FIG. 8 illustrates that the memory controller 1002 is indicated by one block; however, in the memory controller 1002, a controller for controlling the data storage unit 1001 and a controller for controlling the buffer memory 1003, which is a volatile memory, may be independently configured.

The buffer memory 1003 may temporarily store data to be processed by the memory controller 1002, that is, data inputted/outputted to the data storage unit 1001. The buffer memory 1003 may store data DATA applied from the memory controller 1002 according to a control signal. The buffer memory 1003 reads the stored data and outputs the read data to the memory controller 1002. The buffer memory 1003 may include a volatile memory such as a DRAM (Dynamic Random Access Memory), a Mobile DRAM, and a SRAM (Static Random Access Memory).

The input/output interface 1004 provides a physical connection between the memory controller 1002 and an external device (a host), so that the memory controller 1002 may receive a control signal for data input/output from the external device and exchange data with the external device. The input/output interface 1004 may include one of various interface protocols such as a USB, a MMC, a PCI-E, a SAS, a SATA, a PATA, a SCSI, an ESDI, and an IDE.

The electronic system 1000 may be used as an auxiliary storage device of a host device or an external storage device. The electronic system 1000 may include a solid state disk (SSD), a universal serial bus memory (USB), a secure digital card (SD), a mini secure digital card (mSD), a micro secure digital card (micro SD), a high capacity secure digital card (SDHC; secure digital high capacity), a memory stick card, a smart media card (SM), a multimedia card (MMC), an embedded multimedia card (eMMC), a compact flash card (CF) and the like.

While various embodiments have been described above, it will be understood to those skilled in the art that the embodiments described are by way of example only. Accordingly, the semiconductor device and the semiconductor system described herein should not be limited based on the described embodiments.

What is claimed is:

1. A semiconductor system comprising:
   a first semiconductor device configured to output a test stop signal and a calibration control signal; and
   a second semiconductor device configured to generate a first state code from an external resistor, a second state code from an internal resistor, and a third state code from a fuse array in response to the calibration control signal, and to select one of the first to third state codes as a selection code in response to the test stop signal and the calibration control signal.

2. The semiconductor system of claim 1, wherein the second semiconductor device includes a pad coupled to the external resistor.

3. The semiconductor system of claim 2, wherein the second semiconductor device comprises:
   a state code generation unit configured to compare a reference voltage generated in response to the calibration control signal with a voltage of the pad to generate a driving code for driving the voltage of the pad and a voltage of an internal node, and to compare the voltage of the internal node with the reference voltage to generate the first state code for driving the voltage of the internal node.

4. The semiconductor system of claim 3, wherein the state code generation unit comprises:
   a first comparator configured to compare the reference voltage with the voltage of the pad to generate the driving code; and
   a first pull-up driving section configured to pull-up drive the voltage of the pad in response to the driving code.

5. The semiconductor system of claim 4, wherein the state code generation unit comprises:
   a second pull-up driving section configured to pull-up drive the voltage of the internal node in response to the driving code;
   a second comparator configured to compare the reference voltage with the voltage of the internal node to generate the first state code; and
   a pull-down driving section configured to pull-down drive the voltage of the internal node in response to the first state code.

6. The semiconductor system of claim 1, wherein the second semiconductor device comprises:
   a state code generation unit configured to compare an internal reference voltage with a voltage of a first internal node, to which the internal resistor is coupled, to generate a driving code for driving the voltage of the first internal node and a voltage of a second internal node, and to compare the voltage of the second internal node with the internal reference voltage to generate the second state code for driving the voltage of the second internal node.

7. The semiconductor system of claim 6, wherein the state code generation unit comprises:
   a first comparator configured to compare the internal reference voltage with the voltage of the first internal node to generate the driving code; and
   a first pull-up driving section configured to pull-up drive the voltage of the first internal node in response to the driving code.

8. The semiconductor system of claim 7, wherein the state code generation unit comprises:
   a second pull-up driving section configured to pull-up drive the voltage of the second internal node in response to the driving code;
   a second comparator configured to compare the internal reference voltage with the voltage of the second internal node to generate the second state code; and
   a pull-down driving section configured to pull-down drive the voltage of the second internal node in response to the second state code.

9. The semiconductor system of claim 1, wherein the fuse array includes two or more fuses which are programmed by using laser or electricity.

10. The semiconductor system of claim 1, wherein the second semiconductor device comprises:
    a first selector configured to select and output the first state code or the second state code in response to a first selection signal generated in response to the calibration control signal; and
    a second selector configured to select and output the third state code or an output signal of the first selector in response to the third state code.

11. The semiconductor system of claim 10, wherein the second selector outputs the third state code when the fuse array has been programmed.

12. The semiconductor system of claim 10, wherein the second semiconductor device further comprises:
    an output buffer configured to buffer an output signal of the second selector and output the buffered signal as the selection code in a state in which the test stop signal has been disabled.

13. A semiconductor device comprising:
    a first state code generation unit configured to generate a first state code from an external resistor in response to a calibration control signal;
    a second state code generation unit configured to generate a second state code from an internal resistor;
    a third state code generation unit configured to generate a third state code from a fuse array; and
    a code selection unit configured to output one of the first to third state codes as a selection code in response to the calibration control signal and a test stop signal.

14. The semiconductor device of claim 13, wherein the semiconductor device further includes a pad coupled to the external resistor.

15. The semiconductor device of claim 14, wherein the first state code generation unit compares a reference voltage generated in response to the calibration control signal with a voltage of the pad to generate a driving code for driving the voltage of the pad and a voltage of an internal node, and to compare the voltage of the internal node with the reference voltage to generate the first state code for driving the voltage of the internal node.

16. The semiconductor device of claim 15, wherein the first state code generation unit comprises:
    a first comparator configured to compare the reference voltage with the voltage of the pad to generate the driving code;
    a first pull-up driving section configured to pull-up drive the voltage of the pad in response to the driving code;
    a second pull-up driving section configured to pull-up drive the voltage of the internal node in response to the driving code;
    a second comparator configured to compare the reference voltage with the voltage of the internal node to generate the first state code; and
    a pull-down driving section configured to pull-down drive the voltage of the internal node in response to the first state code.

17. The semiconductor device of claim 13, wherein the second state code generation unit compares an internal reference voltage with a voltage of a first internal node, to which the internal resistor is coupled, to generate a driving code for driving the voltage of the first internal node and a voltage of a second internal node, and compares the voltage of the second internal node with the internal reference voltage to generate the second state code for driving the voltage of the second internal node.

18. The semiconductor device of claim 13, wherein the fuse array includes two or more fuses which are programmed by using laser or electricity.

19. The semiconductor device of claim 13, wherein the code selection unit comprises:
    a first selector configured to select and output the first state code or the second state code in response to a first selection signal generated in response to the calibration control signal; and
    a second selector configured to select and output the third state code or an output signal of the first selector in response to the third state code.

20. A semiconductor device comprising:
a first state code generation unit configured to generate a first state code from an external resistor in response to a calibration control signal;
a second state code generation unit configured to generate a second state code from an internal resistor in response to the calibration control signal;
a third state code generation unit configured to generate a third state code from a fuse array; and
a code selection unit configured to output one of the first to third state codes as a selection code in response to the calibration control signal and a test stop signal.

* * * * *